(12) United States Patent
Guzman-Casillas et al.

(10) Patent No.: US 8,346,402 B2
(45) Date of Patent: Jan. 1, 2013

(54) ISLANDING DETECTION IN AN ELECTRICAL POWER DELIVERY SYSTEM

(75) Inventors: Armando Guzman-Casillas, Pullman, WA (US); Mangapathirao Venkata Mynam, Pullman, WA (US); Marcos A. Donolo, Pullman, WA (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 257 days.

(21) Appl. No.: 12/777,128

(22) Filed: May 10, 2010

(65) Prior Publication Data
US 2010/0286838 A1 Nov. 11, 2010

Related U.S. Application Data

(60) Provisional application No. 61/177,229, filed on May 11, 2009.

(51) Int. Cl.
*G06F 1/28* (2006.01)
*G06F 19/00* (2006.01)
*G01R 21/00* (2006.01)
*G01R 31/00* (2006.01)

(52) U.S. Cl. ............. 700/293; 702/58; 702/60; 700/292

(58) Field of Classification Search .................... 700/22, 700/286, 292, 293, 295; 702/58, 60; 307/86, 307/81
See application file for complete search history.

(56) References Cited

U.S. PATENT DOCUMENTS

| | | |
|---|---|---|
| 4,636,909 A | 1/1987 | Brandt |
| 4,672,501 A | 6/1987 | Bilac |
| 4,715,000 A | 12/1987 | Premerlani |
| 4,829,298 A | 5/1989 | Fernandes |
| 5,006,846 A | 4/1991 | Granville |
| 5,224,011 A | 6/1993 | Yalla |
| 5,398,029 A | 3/1995 | Toyama |
| 5,446,682 A | 8/1995 | Janke |
| 5,498,956 A | 3/1996 | Kinney |
| 5,592,393 A | 1/1997 | Yalla |
| 5,721,689 A | 2/1998 | Hart |
| 5,805,395 A | 9/1998 | Hu |
| 5,809,045 A | 9/1998 | Adamiak |
| 5,995,911 A | 11/1999 | Hart |
| 6,121,886 A | 9/2000 | Andersen |
| 6,141,196 A | 10/2000 | Premerlani |
| 6,148,267 A | 11/2000 | Premerlani |

(Continued)

OTHER PUBLICATIONS

Edmund O. Schweitzer, III, David Whitehead, Armando Guzman, Yanfeng Gong, Marcos Donolo, Advanced Real-Time Synchrophasor Applications, Oct. 2008.

(Continued)

*Primary Examiner* — Charles Kasenge
(74) *Attorney, Agent, or Firm* — Stoel Rives LLP

(57) ABSTRACT

An intelligent electronic device is operable to use a signal derived from an electrical power delivery system to effectively detect an islanding condition. The intelligent electronic device is configured to compare a frequency deviation (from nominal frequency) and a rate-of-change of frequency of the electrical power delivery system to a protection characteristic of the intelligent electronic device to quickly and securely detect islanding conditions thereby enhancing power protection, automation, control, and monitoring performance. The intelligent electronic device uses local measurements of the electrical power deliver system to provide reliable and economical means to properly separate a generation site from the remainder of the electrical power delivery system. Such may be useful to prevent reclosing out of synchronism.

35 Claims, 10 Drawing Sheets

U.S. PATENT DOCUMENTS

| | | | |
|---|---|---|---|
| 6,236,949 B1 | 5/2001 | Hart | |
| 6,311,307 B1 | 10/2001 | Adamiak | |
| 6,313,614 B1 | 11/2001 | Persson | |
| 6,324,039 B1 | 11/2001 | Gross | |
| 6,366,864 B1 | 4/2002 | Kulidjian | |
| 6,426,856 B1 | 7/2002 | Schneerson | |
| 6,446,682 B1 | 9/2002 | Viken | |
| 6,456,056 B1 * | 9/2002 | Katoh et al. | 307/87 |
| 6,456,947 B1 | 9/2002 | Adamiak | |
| 6,571,182 B2 | 5/2003 | Adamiak | |
| 6,603,298 B2 | 8/2003 | Guzman-Casillas | |
| 6,662,124 B2 | 12/2003 | Schweitzer, III et al. | |
| 6,717,394 B2 | 4/2004 | Elms | |
| 6,738,269 B2 * | 5/2004 | Nomiya et al. | 307/87 |
| 6,801,442 B2 * | 10/2004 | Suzui et al. | 363/55 |
| 6,815,932 B2 | 11/2004 | Wall | |
| 6,845,333 B2 | 1/2005 | Anderson | |
| 6,934,654 B2 | 8/2005 | Benmouyal | |
| 7,230,809 B2 | 6/2007 | Whitehead | |
| 7,304,403 B2 | 12/2007 | Xu | |
| 7,328,114 B2 * | 2/2008 | Premerlani et al. | 702/75 |
| 7,432,618 B2 | 10/2008 | Taylor | |
| 7,453,674 B2 | 11/2008 | Kuehnle | |
| 7,930,117 B2 | 4/2011 | Guzman-Casillas | |
| 2001/0012984 A1 | 8/2001 | Adamiak | |
| 2004/0186669 A1 | 9/2004 | Benmouyal | |
| 2006/0069522 A1 | 3/2006 | Bruno | |
| 2006/0247874 A1 | 11/2006 | Premerlani | |
| 2007/0008033 A1 | 1/2007 | Okazaki | |
| 2007/0086134 A1 | 4/2007 | Zweigle | |
| 2007/0136013 A1 | 6/2007 | Premerlani | |
| 2008/0122293 A1 | 5/2008 | Ohm | |
| 2010/0161263 A1 | 6/2010 | Benmouyal | |

OTHER PUBLICATIONS

Cooper Power Systems, Product Brief, iGR-933 Rotating Equipment Isolating Device, Nov. 2007.

Cooper Power Systems, Protective Relays, iGR-933 Rotating Equipment Isolating Device (web page) <http://www.cooperpower.com/products/protective/idea/reid.asp> visited on Sep. 3, 2009.

John Mulhausen, Joe Schaefer, Mangapathirao Mynam, Armando Guzman, Marcos Donolo, Anti-Islanding Today, Successful Islanding in the Future, Sep. 18, 2009.

Venkat Mynam, Armando Guzman, Islanding Detection and Adaptive Load Shedding, Sep. 30, 2009.

Armando Guzman, Venkat Mynam, Islanding Detection for Distributed Generation, Aug. 27, 2009.

Tyco Electronics UK Limited, Crompton Instruments, Installation and Operating Instructions R.O.C.O.F. Protection Relay, Nov. 2008.

E. Roy Hamilton, John Undrill, Paul S. Hamer, Scott Manson, Considerations for Generation in an Islanded Operation, Apr. 16, 2009.

Musaab M. Almulla, Mohammed Akhil Fazil, Nicholas Seeley, Energy Management Systems for Islanded Industrial Facilities, Jan. 23, 2009.

Boungwook Cho, Heechul Kim, Musaab M. Almulla, Nicholas C. Seeley, The Application of a Redundant Load-Shedding System for Islanded Power Plants, Oct. 20, 2008.

Gabriel Benmouyal, Angelo D'Aversa, Concurrent Implementation of 81 Frequency Elements Together with Frequency Tracking in Protective Relays: Issues and Solutions, Sep. 18, 2009.

Daqing Hou, Relay Element Performance During Power System Frequency Excursions, Aug. 24, 2007.

A. G. Phadke, J. S. Thorp, M. G. Adamiak, A New Measurement Technique for Tracking Voltage Phasors, Local System Frequency, and Rate of Change of Frequency, IEEE Transactions on Power Apparatus and Systems, vol. PAS-102, No. 5, May 1983.

P J Moore, J H Allmeling, A T Johns, Frequency Relaying Based on Instantenous Frequency Measurement, IEEE 96 WM 066-1 PWRD, 1996.

* cited by examiner

ISLANDING DETECTION IN AN ELECTRICAL POWER DELIVERY SYSTEM

RELATED APPLICATIONS

This application claims benefit under 35 U.S.C. §119(e) of U.S. Provisional Application No. 61/177,229, titled "Islanding Detection Element Using Local Measurements," filed May 11, 2009.

TECHNICAL FIELD

This disclosure relates generally to electrical power delivery systems and, more particularly, to detection of islanding conditions using local measurements.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION OF PREFERRED EMBODIMENTS

Figure 1:
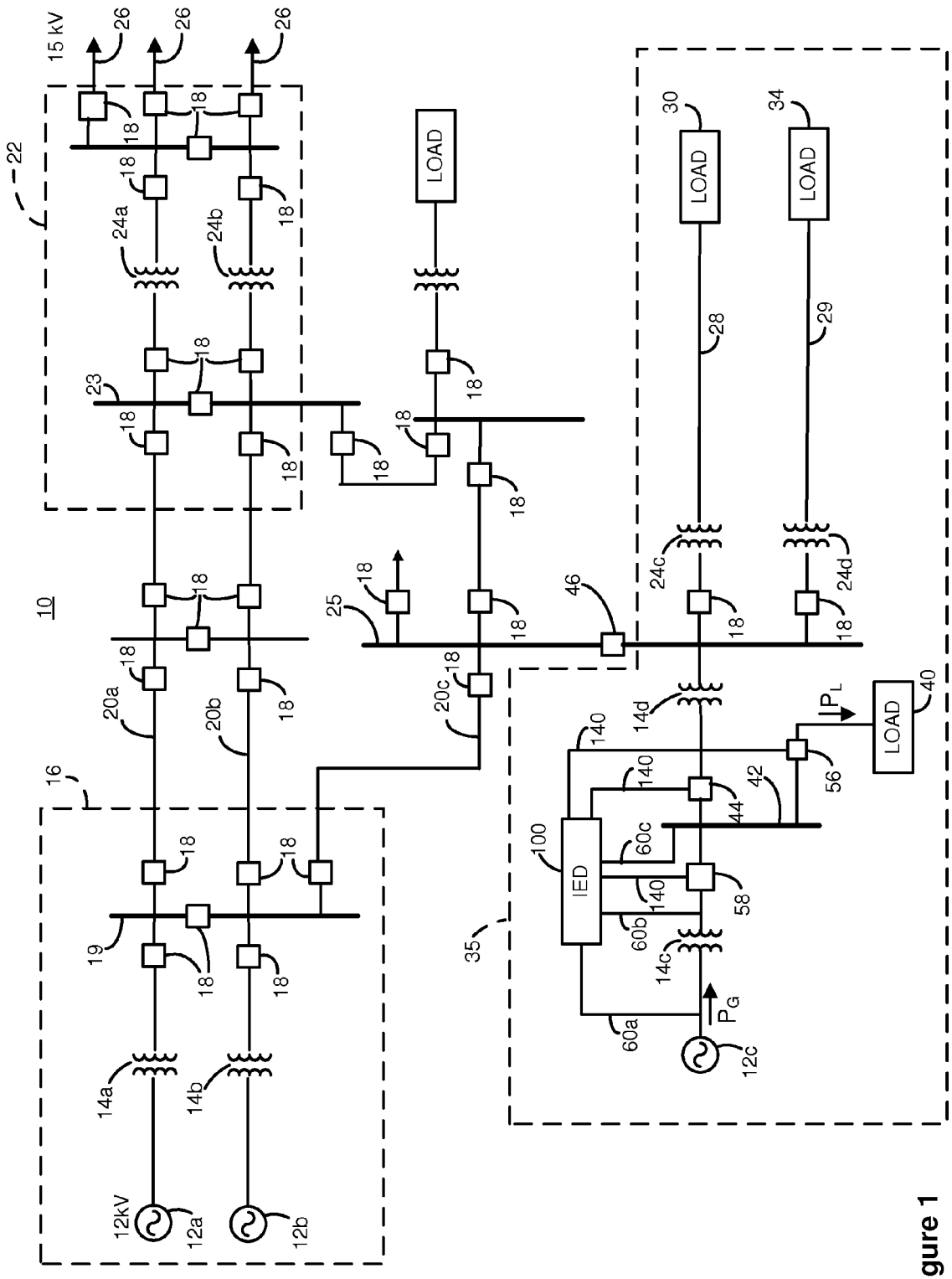
FIG. 1 illustrates a one-line diagram of an electrical power delivery system.

Electrical power delivery systems (including electrical power transmission systems, electrical power distribution systems, electrical power generation, and the like) are designed to deliver electrical power from power generators to loads. Distributed generation sites typically include relatively low-power output generators at industrial plants nearer to a load center than typical generation sites. Undesired operating conditions of the electrical power delivery system may include islanding conditions, frequency excursions, overcurrent conditions, undervoltage conditions, overvoltage conditions, power swing conditions, and the like. An islanding condition may be introduced when a distributed generation site is disconnected from the utility (e.g., a fault on a transmission line, or the like). In such a case, the distributed generation site delivers electric power to the load in the island. Such an islanding condition leads to safety risks to utility personnel and potential power quality issues with the loads that are connected to the distributed generation site. Accordingly, distributed generation sites need to be capable of detecting such an islanding condition and disconnecting themselves from the load center when such an islanding condition is detected.

According to one embodiment, an electrical power delivery system includes an intelligent electronic device that is operable to use certain characteristics of the system's electrical signals to effectively detect islanding conditions. For example, the intelligent electronic device is configured to utilize a unique protection characteristic that is a function of multiple signal characteristics to quickly and accurately detect an islanding condition thereby enhancing power protection and control. Additionally, the intelligent electronic device is capable of effectively distinguishing between an islanding condition and stable oscillations within the electrical power delivery system. Moreover, by detecting islanding conditions and taking proper actions, the intelligent electronic device can prevent out-of-phase closing of circuit breakers, prevent personnel from being injured, and prevent poor-quality power supply. These and other advantages of various embodiments will be apparent to skilled persons upon reading the remainder of this disclosure.

According to one embodiment, the intelligent electronic device includes an input for receiving signals from the electrical power delivery system. The intelligent electronic device also includes a processing unit configured to detect an islanding condition based on the signals. The processing unit is operable to determine a frequency deviation of the electrical power delivery system from nominal frequency and a rate-of-change of frequency of the electrical power delivery system—the frequency deviation and the rate-of-change of frequency defining an operating point of the electrical power delivery system—and to compare the operating point to a protection characteristic. The processing unit is also operable to issue a trip command when the operating point is within a trip region of the protection characteristic. The intelligent electronic device also includes a trip output in communication with the processing unit and a circuit breaker to communicate the trip command from the processing unit to the circuit breaker.

According to one embodiment, the intelligent electronic device detects an islanding condition in the electrical power delivery system by receiving a signal derived from the electrical power delivery system. The intelligent electronic device calculates the operating point of the electrical power delivery system based on the signal. The intelligent electronic device compares the operating point to the protection characteristic to determine whether an islanding condition has occurred.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

For the sake of clarity and conciseness, certain aspects of components or steps of certain embodiments are presented without undue detail where such detail would be apparent to skilled persons in light of the teachings herein and/or where such detail would obfuscate an understanding of more pertinent aspects of the embodiments. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1 is a one-line diagram of an electrical power delivery system 10, according to one embodiment, that includes power generation, transmission, and distribution, together with loads that consume electric power. The system 10 includes, among other things, two generators 12a and 12b configured to generate three-phase sinusoidal waveforms, such as 12 kilovolt (kV) sinusoidal waveforms. The system 10 also includes a generator 12c (e.g., a distributed generator) configured to generate three-phase sinusoidal waveforms (e.g., signals), such as 4.16 kV sinusoidal waveforms. The system 10 includes step-up power transformers 14a, 14b, 14c, and 14d and a number of circuit breakers 18. The step-up power transformers 14a, 14b, and 14d are configured to increase the amplitude of the waveforms generated by generators 12a and 12b and waveforms derived from the waveforms generated by generator 12c to higher voltage sinusoidal waveforms, such as 138 kV sinusoidal waveforms. The step-up power transformers 14a, 14b, and 14d operate to provide the higher voltage sinusoidal waveforms to a number of long distance transmission lines, such as the transmission lines 20a, 20b and 20c. In an embodiment, a first substation (such as a power plant) 16 may be defined to include the two generators 12a and 12b, the two step-up power transformers 14a and 14b and associated circuit breakers 18, all interconnected via a first bus 19. At the end of the long distance transmission lines 20a and 20b (interconnected with a second bus 23), a second substation 22 includes two step-down power transformers 24a and 24b configured to transform the higher voltage sinusoidal waveforms to lower voltage sinusoidal waveforms (e.g., 15 kV) suitable for distribution via one or more distribution lines 26.

A third substation 35 may include the generator 12c, the step-up power transformers 14c and 14d, associated circuit breakers 18, 44, 56 and 58, and second bus 42 as illustrated in FIG. 1. Although the third substation 35 is described as a distributed generation site in the following example, the third substation 35 need not be a distributed generation site (e.g., the third substation 35 may be a typical power station such as a centralized power facility). The distributed generation site 35 also includes two step-down power transformers 24c and 24d on respective distribution lines 28 and 29 to transform the higher voltage sinusoidal waveforms, received via a fourth bus 25, to lower voltage sinusoidal waveforms for distribution to load centers 30 and 34. The step-up transformer 14c is configured to step up the voltage of the waveforms generated by the generator 12c to an acceptable level for delivery to a load 40 connected to the distributed generation site 35. For example, the step-up transformer 14c may step up the voltage to 23 kV. The generator 12c may be designed to supply power to the load 40 connected thereto, and perhaps supply surplus electric power to the remainder of the system 10 via transformer 14d. If insufficient power for load 40 is produced by generator 12c, then power may flow to load 40 via transformer 14d from other parts of the system 10 (e.g., from one or more of the generators 12a and 12b). However, in the case of an islanding condition in which the first substation 16 becomes disconnected from the distributed generation site 35 by opening of, for example, a circuit breaker 46, then the safety risks and power quality issues mentioned above may present themselves.

To detect an islanding condition, the distributed generation site 35 includes an intelligent electronic device (IED) 100, according to one embodiment, connected thereto and configured to monitor for islanding conditions. The IED 100 may be in communication with various parts of the distributed generation site 35 (represented by lines 60a, 60b, and 60c) via various current transformers (CTs) and potential transformers (PTs) configured to supply to the IED 100 waveforms derived from, respectively, the current and voltage of the distributed generation site 35. The IED 100 may further be in communication with various of the circuit breakers (represented by outputs 140), such as circuit breakers 44, 56, and 58 to send command messages thereto to open to disconnect the generator 12c from the system 10. The IED 100 is configured to determine whether an islanding condition exists using local measurements of the distributed generation site 35.

Figure 2:
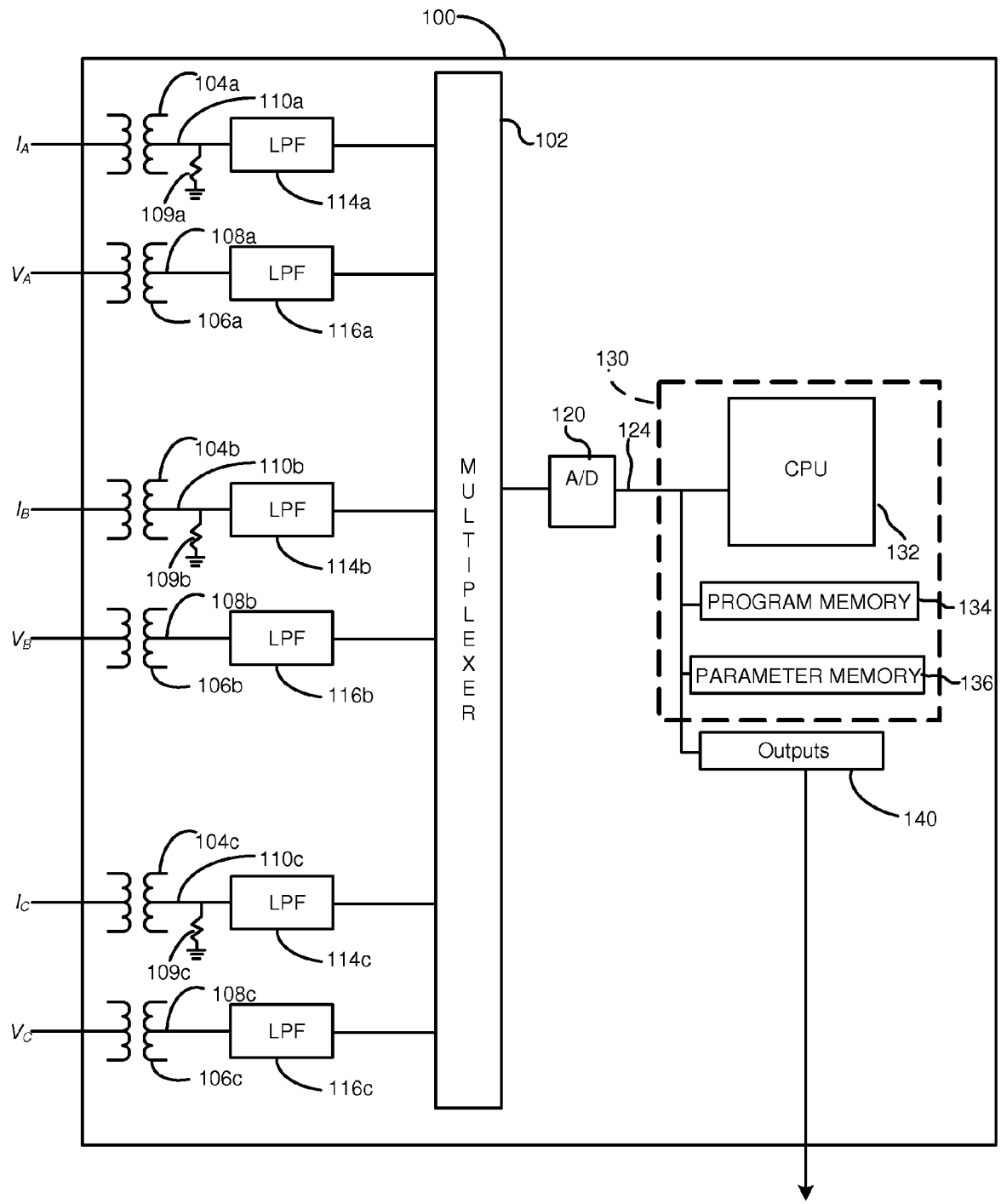
FIG. 2 illustrates a block diagram of an intelligent electronic device configured to obtain electrical power system information and provide protection, control, automation, and/or monitoring to the electrical power delivery system of FIG. 1.

FIG. 2 illustrates a block diagram of an exemplary configuration of the IED 100, which operates to provide such monitoring, protection, automation, and control. The IED 100 may be used, for example, in power system protection, automation, control, and/or metering applications to gather analog data directly from one or more conductors (not shown) using CTs 104a, 104b, and 104c and/or PTs 106a, 106b, and 106c. The PTs 106a, 106b, and 106c may be configured to step-down sensed voltage waveforms $V_A$, $V_B$, and $V_C$ (each corresponding to the secondary voltage of one of the three phases of the three-phase sinusoidal waveforms of the distributed generation site 35) to voltage waveforms 108a, 108b, and 108c having values that can be readily monitored and measured by the IED 100. Similarly, the CTs 104a, 104b, and 104c and resistors 109a, 109b, and 109c may be configured to convert current signals to voltage signals. Low pass filters 114a, 114b, 114c, 116a, 116b, and 116c respectively filter the waveforms 110a, 110b, and 110c that are proportional to the current values and the voltage waveforms 108a, 108b, and 108c. The filtered waveforms are selected using multiplexer 102. The multiplexer 102 may operate at a frequency higher than those of other digital processing components described below to reduce time skewing. An analog-to-digital converter 120 then samples and digitizes the selected waveforms to form corresponding digitized current and voltage signals 124.

The signals 124 are received by a microcontroller 130 configured to perform digital signal processing. For example, the microcontroller 130 may use cosine filters to eliminate DC and unwanted frequency components from the signals 124. In one embodiment, the microcontroller 130 includes a processing unit 132, such as a central processing unit (CPU) or microprocessor, a program memory 134 (e.g., a Flash EPROM), and a parameter memory 136 (e.g., an EEPROM). As will be appreciated by skilled persons, other suitable microcontroller configurations may be used. Further, although discussed in terms of the microcontroller 130, it should be noted that the embodiments disclosed herein may be practiced using one or more different types of processing units, such as field-programmable gate arrays (FPGAs), application specific integrated circuits (ASICs), or other types of programmable logic devices.

The processing unit 132 receives the signals 124 from the analog-to-digital converter 120. The processing unit 132, by executing a computer software program or logic scheme, processes the signals 124 to detect whether an islanding condition has occurred. The processing unit 132 analyzes different characteristics of the signals 124. For example, the processing unit 132 extracts from the signals 124 phasors representative of the measured voltage waveforms 108a, 108b, and 108c and the current waveforms 110a, 110b, and 110c. To obtain the phasors, the processing unit 132 may use a filtering system, such as a full-cycle Fourier filter or a cosine filter. The processing unit 132 then performs various calculations and digital signal processing algorithms using the phasors to determine whether an islanding condition has occurred. The processing unit 132 may also supply a signal (e.g., a trip command 612 described below), via one or more of the outputs 140, to various components of the distributed generation site 35 based on the results of the calculations and digital signal processing.

The processing unit 132 is configured to determine, based on the signals 124, different characteristics of one or more of the waveforms $V_A$, $V_B$, $V_C$, $I_A$, $I_B$, and $I_C$ of the distributed generation site 35. For example, the processing unit may determine the frequency ($f_{signal}$) frequency deviation ($\Delta f$) from nominal frequency (e.g., 60 Hertz (Hz) or 50 Hz), and a rate-of-change of frequency with respect to time (df/dt) of one or more of the waveforms $V_A$, $V_B$, $V_C$, $I_A$, $I_B$, and $I_C$ based on the signals 124. Some techniques for calculating frequency characteristics are described in U.S. patent application Ser. No. 12/343,734 titled "Independent Frequency Measurement and Tracking" naming Gabriel Benmouyal and Angelo D'Aversa as inventors, hereby incorporated by reference in its entirety. By analyzing $f_{signal}$ and/or $\Delta f$ over time, df/dt can be calculated according to conventional methods.

In one example, the processing unit 132 may use a positive-sequence phasor (PSP), such as a positive-sequence voltage phasor derived from the voltage waveforms $V_A$, $V_B$, and $V_C$ or a positive-sequence current phasor derived from current waveforms $I_A$, $I_B$, and $I_C$, to calculate $f_{signal}$, $\Delta f$, and df/dt. Although the following example describes a technique of calculating these frequency characteristics using a positive-sequence voltage phasor, a positive-sequence current phasor may be calculated and used in place of or in conjunction with the positive-sequence voltage phasor. The processing unit 132 may calculate the positive-sequence voltage phasor using the following equation:

$$V_1 = \frac{1}{3}(V_{Aphasor} + aV_{Bphasor} + a^2 V_{Cphasor}) \quad (1)$$

where:

$V_1$ is the positive-sequence voltage phasor;

$V_{Aphasor}$, $V_{Bphasor}$, and $V_{Cphasor}$ are voltage phasors derived from the waveforms $V_A$, $V_B$, and $V_C$ corresponding to a particular point of the system 10; and a is the complex number a=1∠120°.

The characteristics $f_{signal}$, $\Delta f$, and df/dt can be calculated by analyzing the PSP over time. For example, the waveforms $V_A$, $V_B$, and $V_C$, or signals derived therefrom, are sampled at a sampling frequency $f_{sample}$ (e.g., where $f_{sample}$ is an integer multiple of the nominal frequency, $f_{nominal}$), and the PSP corresponding to the waveforms $V_A$, $V_B$, and $V_C$ is analyzed to determine whether the PSP rotates over time in the complex plane. If $f_{signal}$ satisfies a predetermined correspondence with $f_{nominal}$ (e.g., if $f_{signal}$ is equal to $f_{nominal}$), then the PSP will not rotate in the complex plane. When $f_{signal}$ is not equal to $f_{nominal}$, the PSP will rotate in the complex plane. Moreover, when the PSP rotates, the angular speed of rotation is proportional to $\Delta f$.

The frequency difference $\Delta f$ can be calculated by measuring an angle $\psi_m$ (in radians) resulting from the PSP rotation over an interval of time $t_m$. For example, the following equation may be used to calculate $\Delta f$:

$$\Delta f = \frac{\psi_m}{2\pi t_m} \quad (2)$$

Figure 3:
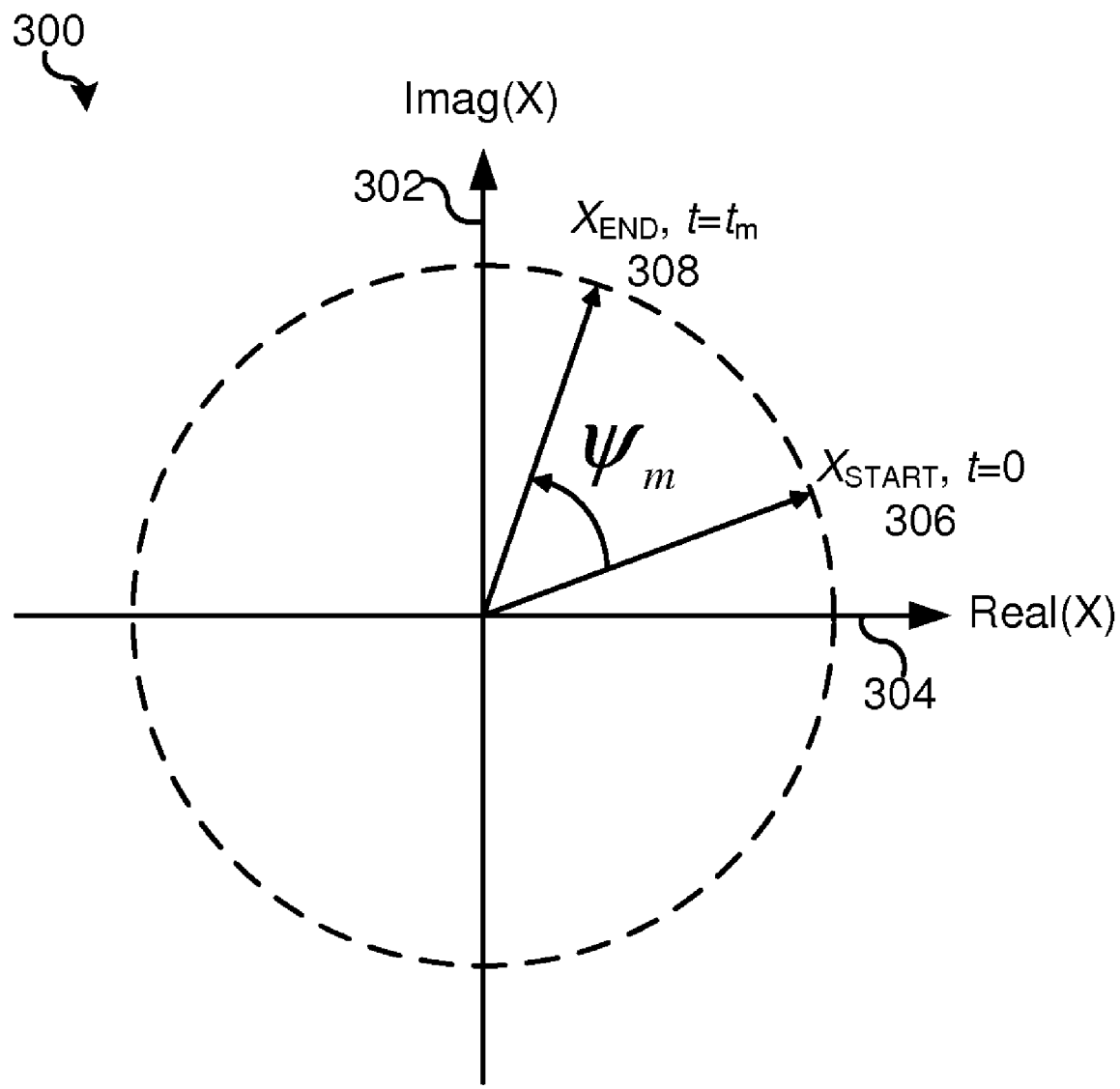
FIG. 3 is a plot of a rotation of a phasor.

FIG. 3 illustrates a plot 300 of the rotation of the PSP through the angle $\psi_m$ from a start time t=0 (306) to an end time t=$t_m$ (308) in the complex plane, which includes a real axis 304 and an imaginary axis 302. The PSP is represented as $X_{START}$, corresponding to the PSP at time t=0, and $X_{END}$, corresponding to the PSP at time t=$t_m$. The angle $\psi_m$ can be computed using:

$$\psi_m = a\tan\left[\frac{imag(X_{END})}{real(X_{END})}\right] - a\tan\left[\frac{imag(X_{START})}{real(X_{START})}\right] \quad (3)$$

Alternatively, the angle can be computed using:

$$\psi_m = a\sin\left\{\frac{imag[X_{END} * conj(X_{START})]}{|X_{END}| * |X_{START}|}\right\} \quad (4)$$

Using the sampling frequency $f_{sample}$ and the number of times per cycle, Q, that the angle $\psi_m$ is calculated (e.g., for calculating the angle $\psi_m$ every quarter of a cycle, Q=4), the frequency difference $\Delta f$ can be calculated using:

$$\Delta f = \frac{\psi_m}{2\pi \frac{Q}{f_{sample}}} \quad (5)$$

Once the frequency difference $\Delta f$ is calculated, a measurement of the signal frequency $f_{signal}$ can be performed using:

$$f_{signal} = \frac{f_{sample}}{N} + \Delta f \quad (6)$$

where N is the number of samples per cycle. Alternatively, using Equation 5, Equation 6 becomes:

$$f_{signal} = \frac{f_{sample}}{N} + \frac{\psi_m}{2\pi \frac{Q}{f_{sample}}} \quad (7)$$

Substituting the value of $\psi$hd m from Equation 4 yields:

$$f_{signal} = f_{sample} \left[ \frac{1}{N} + \frac{a\sin\left\{\frac{imag[X_{END} * conj(X_{START})]}{|X_{END}| * |X_{START}|}\right\}}{2\pi Q} \right] \quad (8)$$

Likewise, substituting the value of $\psi_m$ from Equation 3 yields:

$$f_{signal} = f_{sample} \left[ \frac{1}{N} + \frac{a\tan\left[\frac{imag(X_{END})}{real(X_{END})}\right] - a\tan\left[\frac{imag(X_{START})}{real(X_{START})}\right]}{2\pi Q} \right] \quad (9)$$

The rate-of-change of frequency df/dt can be calculated using a second derivative of $\psi$ with respect to time (i.e., $d^2\psi/dt^2$), for example.

One or more of the frequency characteristics $f_{signal}$, $\Delta f$, and df/dt may be calculated periodically according to one or more of the methods described above. For example, $\Delta f$ and df/dt may be calculated once every quarter of a power system cycle with respect to the nominal frequency. Alternatively, $\Delta f$ and df/dt may be calculated more frequently or less frequently than every quarter of a power system cycle (e.g., once every sixteenth of a cycle, once every 6 cycles).

Figure 4A:
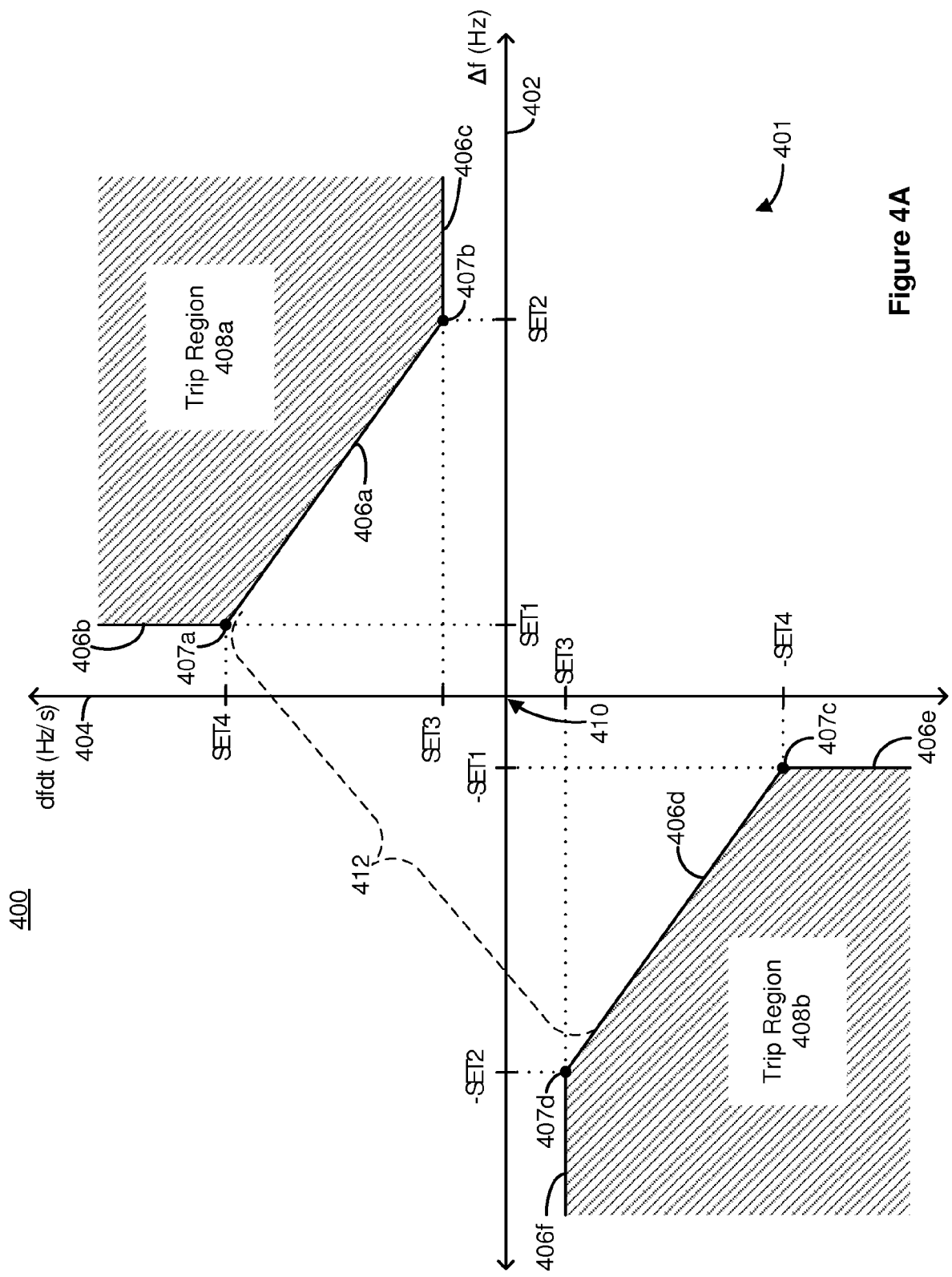
FIGS. 4A and 4B are graphs representing protection characteristics of the intelligent electronic device of FIG. 2.

The processing unit 132 is configured to use one or more of the calculated frequency characteristics to detect an islanding condition. FIG. 4A is a graph of a plane 400 depicting a protection characteristic 401 of the intelligent electronic device 100 according to one embodiment. The plane 400 includes a frequency deviation from nominal frequency axis 402 (in units of Hz) and a rate-of-change of frequency axis 404 (in units of Hz-per-second (Hz/s)) transverse to the frequency deviation axis 402. The protection characteristic 401 includes a trip region 408a (in the first quadrant) bounded by boundary lines 406a, 406b, and 406c and a trip region 408b (in the third quadrant) bounded by boundary lines 406d, 406e, and 406f. An operating point ($\Delta t$ df/dt) of the distributed generation site 35 is obtained from the components of frequency deviation Of and the rate-of-change of frequency df/dt of the site 35. The processing unit 132 operates to compare the operating point to the protection characteristic 401 to determine whether the operating point is in one of the trip regions 408a or 408b.

The trip regions 408a and 408b and their corresponding boundary lines 406a, 406b, 406c, 406d, 406e, and 406f are derived from trip settings SET1, SET2, SET3, and SET4 in which SET1 and SET2 represent selected frequency deviation values and SET3 and SET4 represent selected rate-of-change of frequency values. In one application, SET1 is set to 0.1 Hz, SET2 is set to 1 Hz, SET3 is set to 0.2 Hz/s, and SET4 is set to 2.5 Hz/s. The boundary line 406a is a line segment passing between a first boundary point 407a having coordinates (SET1, SET4) and a second boundary point 407b having coordinates (SET2, SET3). The boundary line 406b is a line extending from the first boundary point 407a in a direction away from the frequency deviation axis 402 and parallel to the rate-of-change of frequency axis 404. The boundary line 406c is a line extending from the second boundary point 407b in a direction away from the rate-of-change of frequency axis 404 and parallel to the frequency deviation axis 402. The boundary line 406d is a line segment passing between a third boundary point 407c having coordinates (−SET1, −SET4) and a fourth boundary point 407d having coordinates (−SET2, −SET3). The boundary line 406e is a line extending from the third boundary point 407c in a direction away from the frequency deviation axis 402 and parallel to the rate-of-change of frequency axis 404. The boundary line 406f is a line extending from the fourth boundary point 407d in a direction away from the rate-of-change of frequency axis 404 and parallel to the frequency deviation axis 402.

As depicted in FIG. 4A, the boundary lines 406a and 406d include negative slopes. The boundary lines 406a and 406d are set at a distance from an origin 410 (representing a state where $\Delta f=0$ and df/dt=0) to define the stable operation region 412 between the trip regions 408a and 408b. The slope of the boundary lines 406a and 406d and their locations with respect to the origin 410 may be determined experimentally to achieve fast and reliable detection of islanding conditions and to prevent stable oscillations from entering one of the trip regions 408a or 408b. The protection characteristic 401 allows the IED 100 to detect an islanding condition faster than a system that does not include the characteristic 401. In a comparative example, a system that does not include trip regions 408a and 408b bounded by boundary lines 406a and 406d may, instead, include a rate-of-change of frequency threshold set at 2.5 Hz/s (representing a horizontal line at 2.5 Hz/s in plane 400) and/or a frequency deviation threshold set at 1 Hz (representing a vertical line at 1 Hz in plane 400)). If an islanding condition occurs in which $\Delta f$ and df/dt increase, the operating point will likely cross the boundary line 406a of the IED 100 before the point crosses a frequency deviation threshold set at 1 Hz and/or a rate-of-change of frequency threshold set at 2.5 Hz/s of the comparative system. Thus, the boundary lines 406a and 406d allow the IED 100 to be relatively sensitive to quickly detect islanding conditions, yet not overly sensitive such that the IED 100 issues false alarm trip commands when some stable oscillations are present in the distributed generation site 35.

Figure 4B:
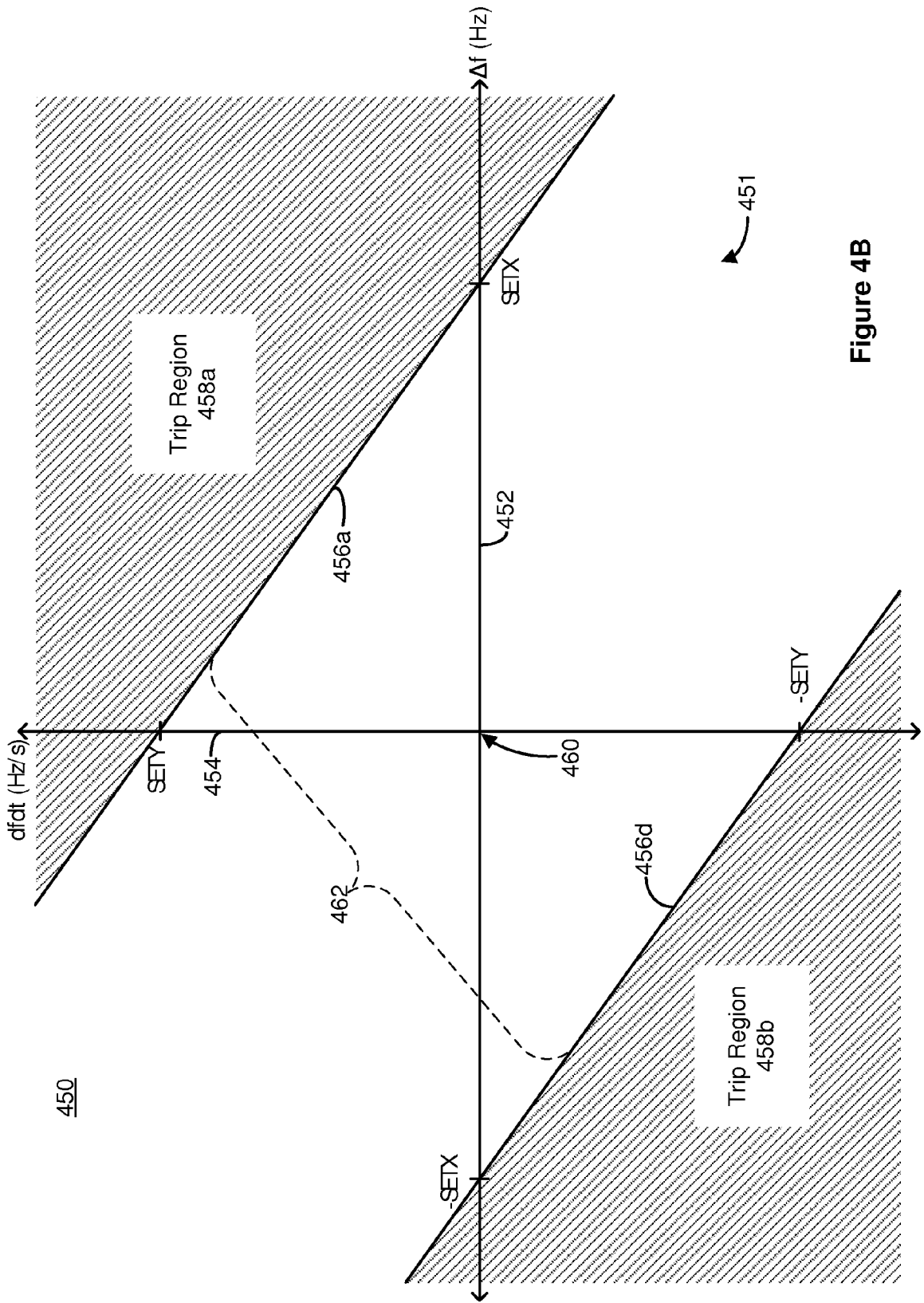

FIG. 4B is a graph of a plane 450 depicting another protection characteristic 451 of the intelligent electronic device 100. As with FIG. 4A, the plane 450 includes a frequency deviation from nominal frequency axis 452 and a rate-of-change of frequency axis 454. The protection characteristic 451 includes a trip region 458a bounded by boundary line 456a, and a trip region 458b bounded by boundary line 456d. An operating point ($\Delta f$, df/dt) of the distributed generation site 35 is obtained from the components of frequency deviation $\Delta f$ and the rate-of-change of frequency df/dt of the site 35. The processing unit 132 operates to compare the operating point to the protection characteristic 451 to determine whether the operating point is in one of the trip regions 458a or 458b.

The trip regions 458a and 458b and their corresponding boundary lines 456a, and 456d are derived from trip settings SETX, and SETY in which SETX represents a selected frequency deviation value and SETY represents a selected rate-of-change of frequency value. In one application, SETX is set to 1.0 Hz, and SETY is set to 2.5 Hz/s. The boundary line 456a is a line passing through the points (SETX, 0) and (0, SETY). The boundary line 456d is a line passing through the points (−SETX, 0) and (0, −SETY).

As depicted in FIG. 4B, the boundary lines 456a and 456d include negative slopes. The boundary lines 456a and 456d are set at a distance from an origin 460 (representing a state where Δf=0 and df/dt=0) to define the stable operation region 462 between the trip regions 458a and 458b. The slope of the boundary lines 456a and 456d and their locations with respect to the origin 460 may be determined experimentally to achieve fast and reliable detection of islanding conditions and to prevent stable oscillations from entering one of the trip regions 458a or 458b. As with the characteristic of FIG. 4A, the protection characteristic 451 allows the IED 100 to detect an islanding condition faster than a system that does not include the characteristic 451.

Figure 5A:
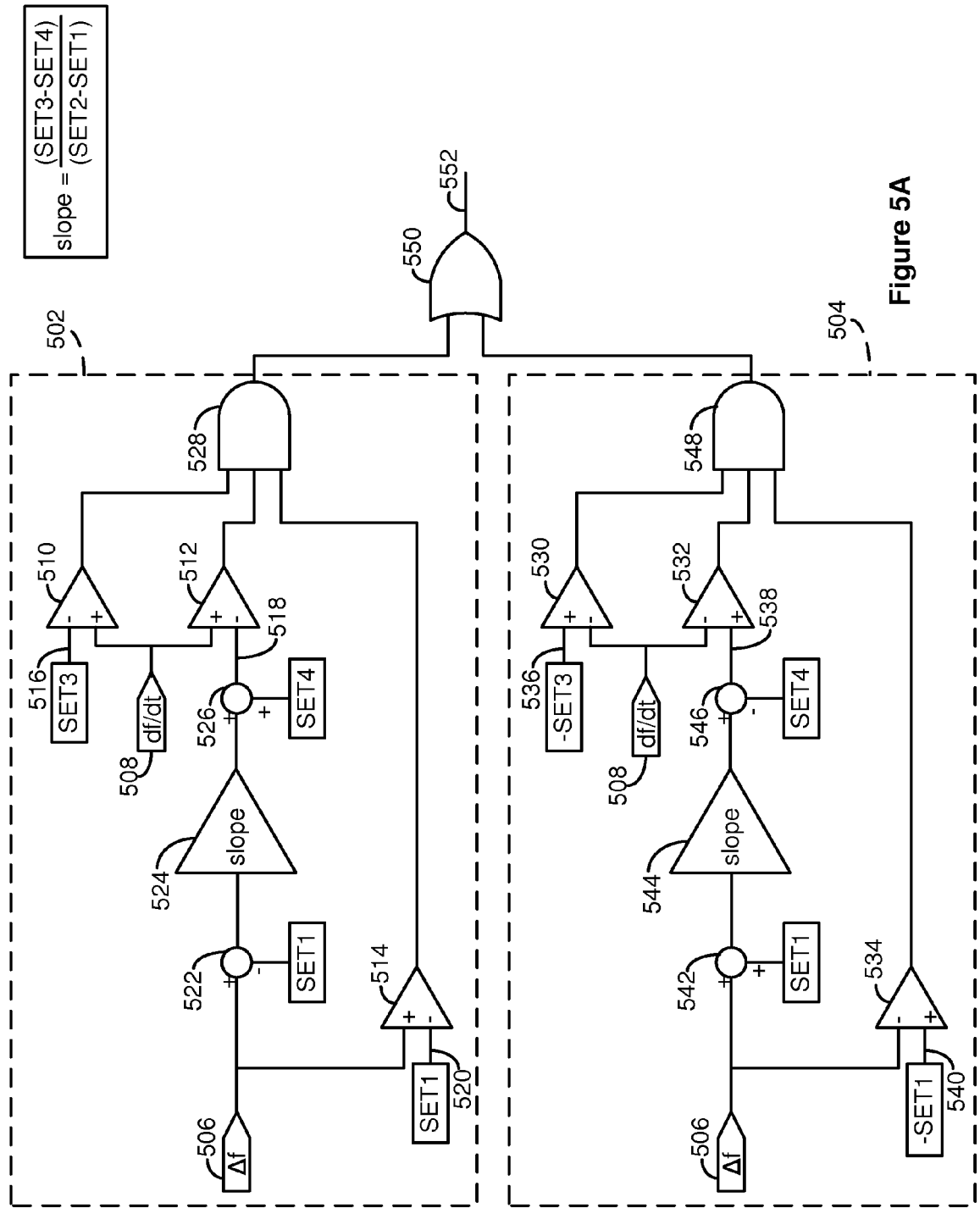
FIGS. 5A and 5B are schematics of islanding detection logic corresponding to the protection characteristic of FIGS. 4A and 4B.

FIG. 5A is a schematic of islanding detection logic corresponding to the protection characteristic 401 that may be implemented by the processing unit 132 according to FIG. 4A. The logic includes a first section 502 corresponding to the trip region 408a and a second section 504 corresponding to the trip region 408b. The sections 502 and 504 include as inputs the frequency deviation Δf 506 and the rate-of-change of frequency df/dt 508 of the power system operating conditions. These inputs (Δt df/dt) define an operating point in the Δf-df/dt plane. First section 502 includes comparators 510, 512, and 514 that compare one of Δf 506 and df/dt 508 to the protection characteristics represented by settings SET1, SET2, SET3, SET4 and functions thereof to determine whether the operating point is inside the trip region 408a. The values of lines 516, 518, and 520 are associated with the boundary lines 406a, 406b, and 406c. That is, the value of line 516—which corresponds to the rate-of-change of frequency value of SET3—is associated with the boundary line 406c; the value of line 518—which is derived from Δf 506, SET1, SET2, SET3, and SET4—is associated with the boundary line 406a; and the value of line 520—which corresponds to the frequency deviation value of SET1—is associated with the boundary line 406b.

The output of comparator 510 indicates whether df/dt is greater than SET3. The output of comparator 512 indicates whether the operating point is within the region defined according to Equation 10:

$$\frac{df}{dt} > [(\Delta f - SET1) * \text{slope}] + SET4 \quad (10)$$

where slope is equal to $$\frac{(SET3 - SET4)}{(SET2 - SET1)}.$$

The output of comparator 514 indicates whether Δf is greater than SET1. The outputs of comparators 510, 512, and 514 are associated with the comparison of the operating point with boundary lines 406c, 406a, and 406b, respectively.

To derive the value of line 518, the frequency deviation value of SET1 is subtracted (represented by subtraction block 522) from Δf 506, the difference is multiplied (represented by multiplication block 524) by the slope of the boundary line 406a—the slope being equal to $$\frac{(SET3 - SET4)}{(SET2 - SET1)}$$

—and the resulting product is added (represented by addition block 526) to SET4.

When the operating point is inside of the trip region 408a (defined by the boundary lines) in the first quadrant, the output of AND 528 asserts to indicate the islanding operating condition. The outputs of the comparators 510, 512, and 514 are supplied to an AND gate 528, which asserts a logic high—indicating that the operating point is inside the trip region 408a—when df/dt 508 is greater than the values of lines 516 and 518 and Δf 506 is greater than the value of line 520. In other words, section 502 detects that the operating point is inside the trip region 408a when the following inequalities are true:

$$\frac{df}{dt} > SET3; \quad (11)$$

$$\frac{df}{dt} > \left((\Delta f - SET1) \times \left(\frac{(SET3 - SET4)}{(SET2 - SET1)}\right)\right) + SET4; \text{ and} \quad (12)$$

$$\Delta f > SET1. \quad (13)$$

Second section 504 includes comparators 530, 532, and 534 that compare one of Δf 506 and df/dt 508 to protection characteristics represented by settings SET1, SET2, SET3, SET4, and functions thereof to determine whether the operating point is inside the trip region 408b. The values of lines 536, 538, and 540 are associated with the boundary lines 406d, 406e, and 406f. That is, the value of line 536—which corresponds to a negative of the rate-of-change of frequency value of SET3 (i.e., −SET3)—is associated with the boundary line 406f; the value of line 538—which is derived from Δf 506, SET1, SET2, SET3, and SET4—is associated with the boundary line 406d; and value of line 540—which corresponds to a negative of the frequency deviation value of SET1—is associated with the boundary line 406e.

The output of comparator 530 indicates whether df/dt is less than −SET3. The output of comparator 532 indicates whether the operating point is within the region defined according to Equation 14:

$$\frac{df}{dt} < [(\Delta f + SET1) * \text{slope}] - SET4 \quad (14)$$

where slope is equal to $$\frac{(SET3 - SET4)}{(SET2 - SET1)}.$$

The output of comparator 534 indicates whether Δf is less than −SET1. The outputs of comparators 530, 532, and 534 are associated with the comparison of the operating point with the boundary lines 406f, 406d, and 406e, respectively.

To derive the value of line 538, the frequency deviation value of SET1 is added (represented by addition block 542) to Δf 506, the sum is multiplied (represented by multiplication block 544) by the slope of the boundary line 406d—the slope being equal to $$\frac{(SET3 - SET4)}{(SET2 - SET1)}$$

—and the resulting product is subtracted (represented by subtraction block 546) from SET4.

When the operating point is inside of the trip region 408b (defined by the boundary lines) in the third quadrant, the output of AND 548 asserts to indicate the islanding operating condition. The outputs of the comparators 530, 532, and 534 are supplied to an AND gate 548, which asserts a logic high—indicating that the operating point is in the trip region 408b—when df/dt 508 is less than the values of lines 536 and 538 and Δf 506 is less than the value of line 540. In other words, section 504 detects that the operating point is inside the trip region 408b when the following inequalities are true:

$$\frac{df}{dt} < -SET3; \quad (15)$$

$$\frac{df}{dt} < \left((\Delta f + SET1) \times \left(\frac{(SET3 - SET4)}{(SET2 - SET1)}\right)\right) - SET4; \text{ and} \quad (16)$$

$$\Delta f < -SET1. \quad (17)$$

Outputs of AND gates 528 and 548 are supplied to an OR gate 550, which asserts a logic high at its output 552 when AND gate 528 or AND gate 548 indicates that the operating point is inside one of the trip regions 408a and 408b.

Figure 5B:
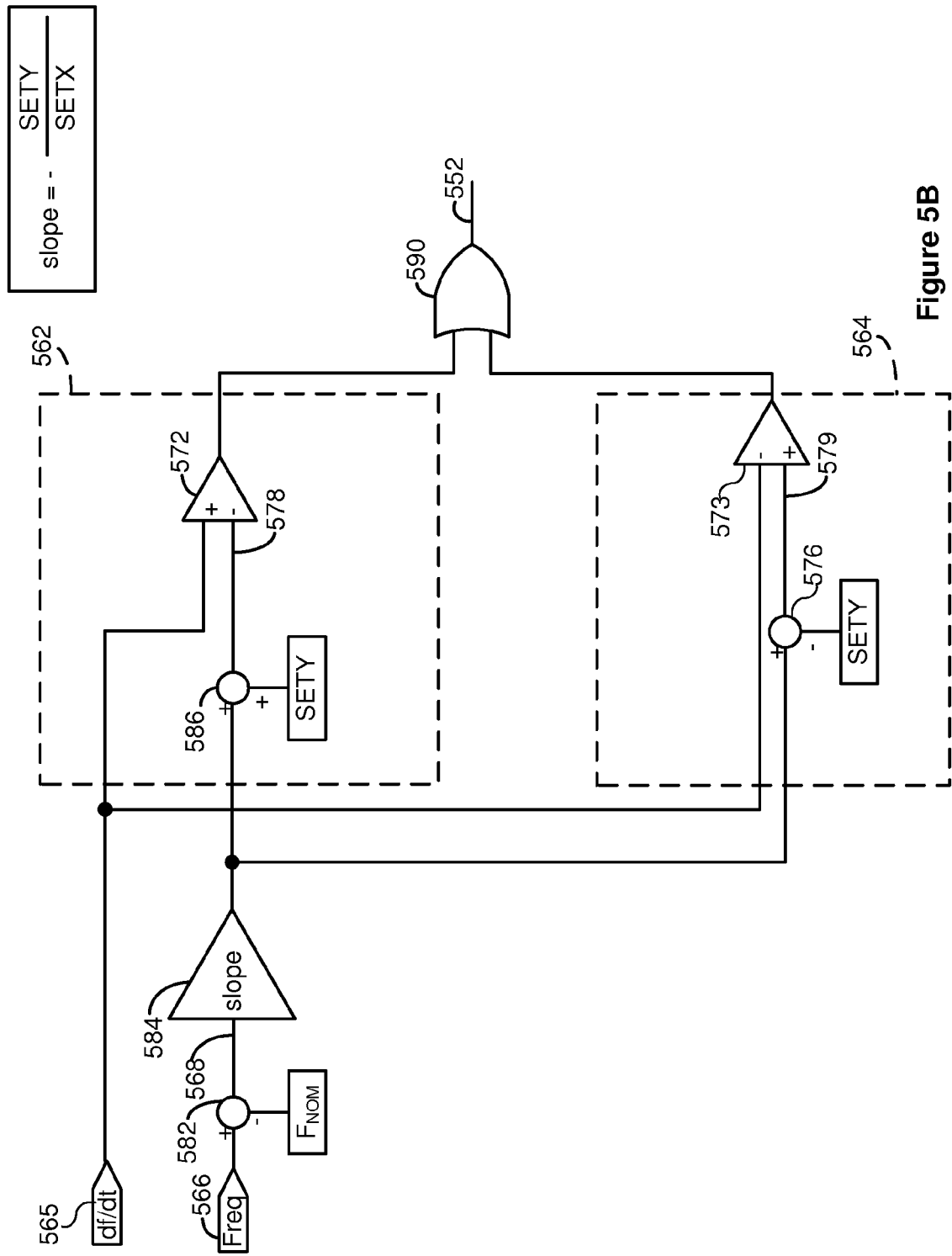

FIG. 5B is a schematic of islanding detection logic corresponding to the protection characteristic 451 that may be implemented by the processing unit 132 according to FIG. 4B. The logic includes a first section 562 corresponding to the trip region 458a and a second section 564 corresponding to the trip region 458b. The sections 562 and 564 include as inputs the rate-of-change of frequency df/dt 565, and the frequency deviation Δf 568 multiplied (represented by multiplication block 584) by the slope of the boundary lines 456a and 456d. The frequency deviation Δf 568 is calculated from the measured system frequency 566 being summed with the negative of the nominal frequency in addition block 582. The slope is calculated as the negative of the ratio of SETY to SETX:

$$SLOPE = -\frac{SETY}{SETX} \quad (18)$$

First section 562 compares the rate-of-change of frequency df/dt 565 against the sum 578 (from addition block 586) of SETY and the product of the frequency deviation Δf 568 multiplied by the slope. If df/dt 565 is greater than the sum 578, then a high output from comparator 572 is sent to OR gate 590. Accordingly, the operating point is determined to be within trip region 458a if the following condition is met:

$$\frac{df}{dt} > \Delta f * SLOPE + SETY \quad (19)$$

Similarly, second section 564 compares the rate-of-change of frequency df/dt 565 against the sum 579 of –SETY (from addition block 576) and the product of the frequency deviation Δf 568 multiplied by the slope. If df/dt 565 is less than the sum 579, then a high output from comparator 573 is sent to OR gate 590. Accordingly, the operating point is determined to be within trip region 458b if the following condition is met:

$$\frac{df}{dt} < \Delta f * SLOPE - SETY \quad (20)$$

If either comparator 572 or 573 are high, then OR gate 590 issues a logic high at its output 552.

Figure 6:
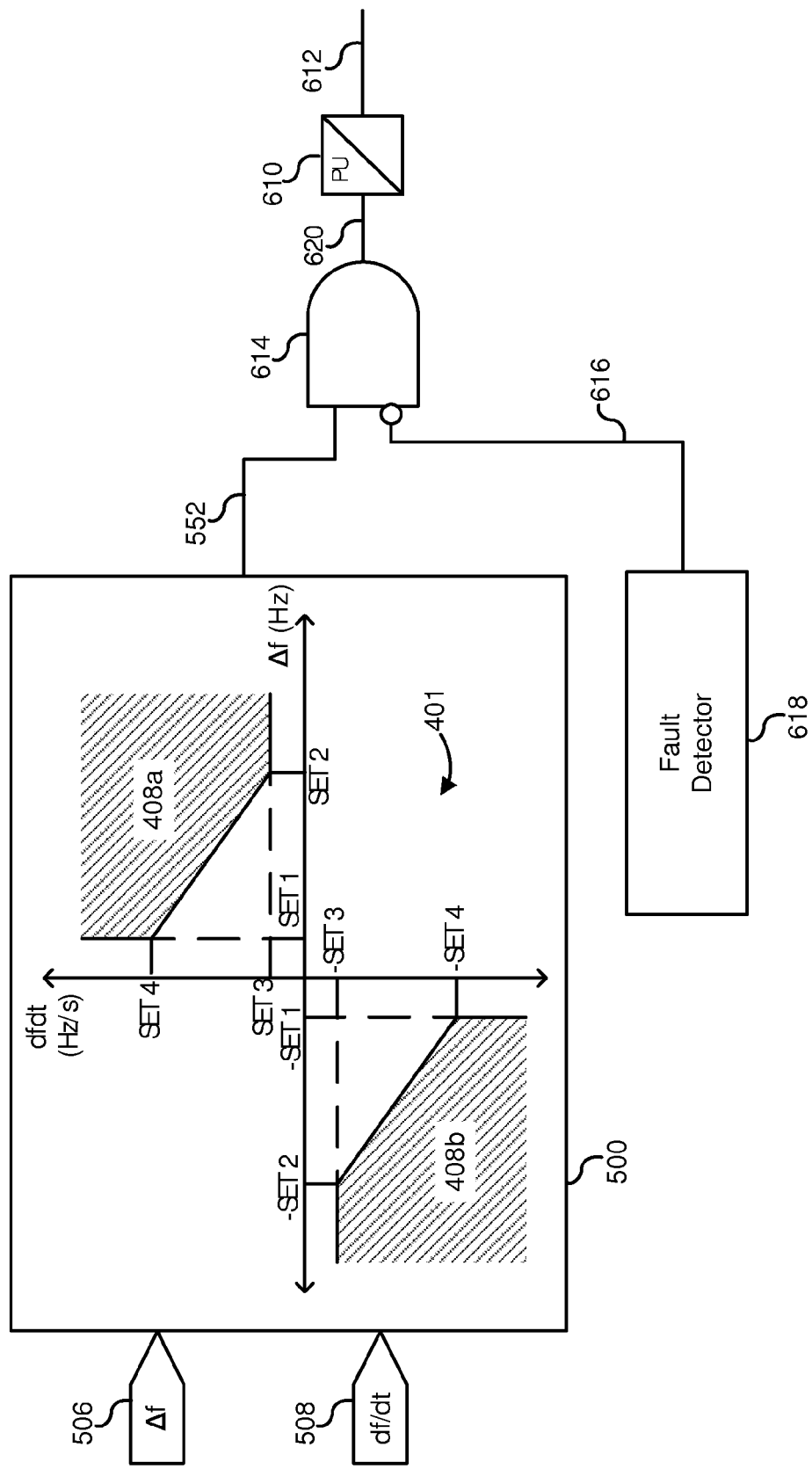
FIG. 6 is a block diagram of a monitoring and protection scheme used by the intelligent electronic device of FIG. 2.

FIG. 6 is a logic diagram of an exemplary monitoring and protection scheme 600 that may be executed by the processing unit 132. Scheme 600 is described with reference to protection characteristic 401. However, scheme 600 may also be implemented with protection characteristic 451. The operating point values Δf 506 and df/dt 508 are supplied to the islanding detection logic 500 corresponding to the protection characteristic 401 as described above, and the islanding detection logic 500 determines whether the operating point is inside one of the trip regions 408a and 408b. When the operating point enters one of the trip regions 408a and 408b, the output 552 of OR gate 550 is asserted, and is an input to an AND gate 614. If a fault is not detected by a fault detector 618, AND gate 614 asserts its output 620, which starts a timer 610. If the timer 610 remains asserted for a predetermined pickup period, which may include a predetermined number of samples, predetermined number of cycles, predetermined amount of time (e.g., from about 0 millisecond (ms) to about 50 ms, preferably about 50 ms), or the like, then a trip command 612 (e.g., a logic high) is formed. However, if the operating point leaves the trip region 408a or 408b before expiration of the pickup period, the output 620 becomes low, which stops and resets the timer 610, and the trip command 612 is not formed.

Fault detector 618 may be any type of element, such as an overcurrent element, undervoltage element, incremental quantity element, or the like. Fault detector 618 may be housed in a unit separate from the IED 100 and may supply the signal 616 to the IED 100, or fault detector 618 may correspond to a system (e.g., protective fault detection logic) of processing unit 132 or another processing unit in the IED 100. For example, fault detector 618 may detect an overcurrent condition in second substation 22, which may affect the frequency of the distributed generation site 35. When fault detector 618 detects a fault in system 10, signal 616 forces AND gate 614 to transmit a logic low output regardless of the state of output 552. On the other hand, when fault detector 618 has not detected a fault in system 10 and output 552 is asserted, the system transmits trip command 612 to a circuit breaker (e.g., circuit breaker 44), via one or more of the outputs 140 described above.

In one example, the IED 100 is configured to trip the generator 12c by sending the trip command 612 to circuit breaker 58, thus removing the generator 12c from supplying power to any load. This action eliminates the safety risks that may otherwise occur if the distributed generation site 35 was allowed to remain connected to the islanded region.

Figure 7:
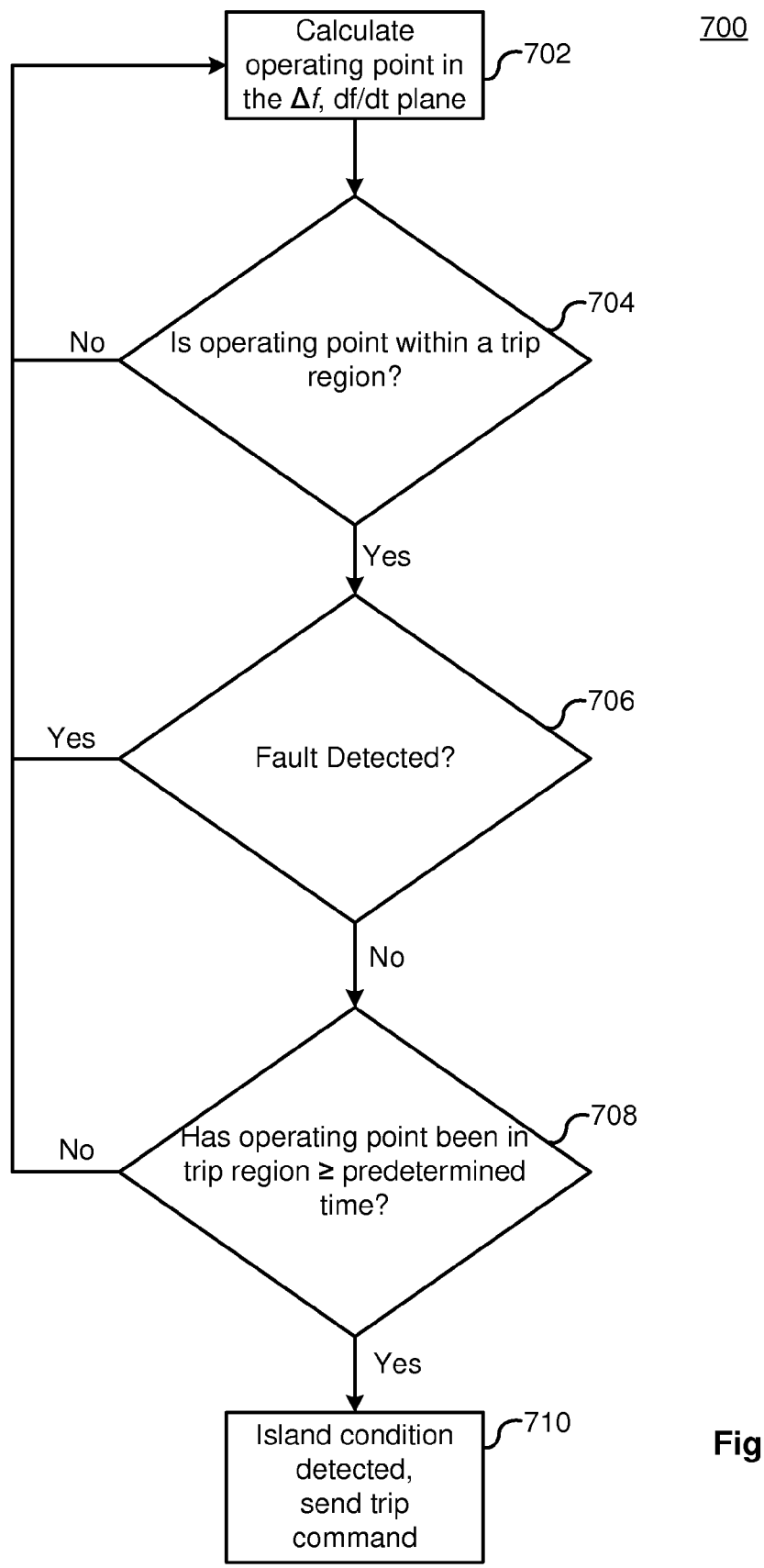
FIG. 7 is flow chart of a protection method that may be implemented by the intelligent electronic device of FIG. 2.

FIG. 7 is a flow chart of a protection method 700, according to one example, that may be implemented by the IED 100 to detect an islanding condition and send the trip command 612 to a circuit breaker. Method 700 is described with reference to protection characteristic 401. However, method 700 may also be implemented with protection characteristic 451. First, the processing unit 132 receives the signals 124 and calculates the operating point (Δf, df/dt) in the Δ–df/dt plane, of one or more of the waveforms $V_A$, $V_B$, $V_C$, $I_A$, $I_B$, and $I_C$ (step 702). The processing unit 132 compares the operating point to the protection characteristic 401 to determine whether the operating point is inside one of the trip regions 408a and 408b (step 704). If the operating point is not inside one of the trip regions 408a and 408b, the processing unit 132 repeats (e.g., every quarter of a cycle) steps 702 and 704.

If the operating point is inside one of the trip regions 408a and/or 408b, then the processing unit 132 determines whether the fault detector 618 has detected a fault in the system 10 (step 706). If the fault detector 618 has detected a fault, the processing unit repeats steps 702 and 704. If the fault detector 618 has not detected a fault, the processing unit 132 determines whether the operating point has been inside trip region 408a or 408b for at least a predetermined amount of time (e.g., 50 ms) (step 708). If the operating point has been in trip region 408a or 408b for less than the predetermined amount of time, the processing unit 132 repeats steps 702 and 704. If the operating point has been in the trip region 408a or 408b for at least the predetermined amount of time, the trip command 612 is sent to one or more of the circuit breakers to disconnect the distributed generation site 35 and/or the generator 12c from the system 10 (step 710).

Figure 8:
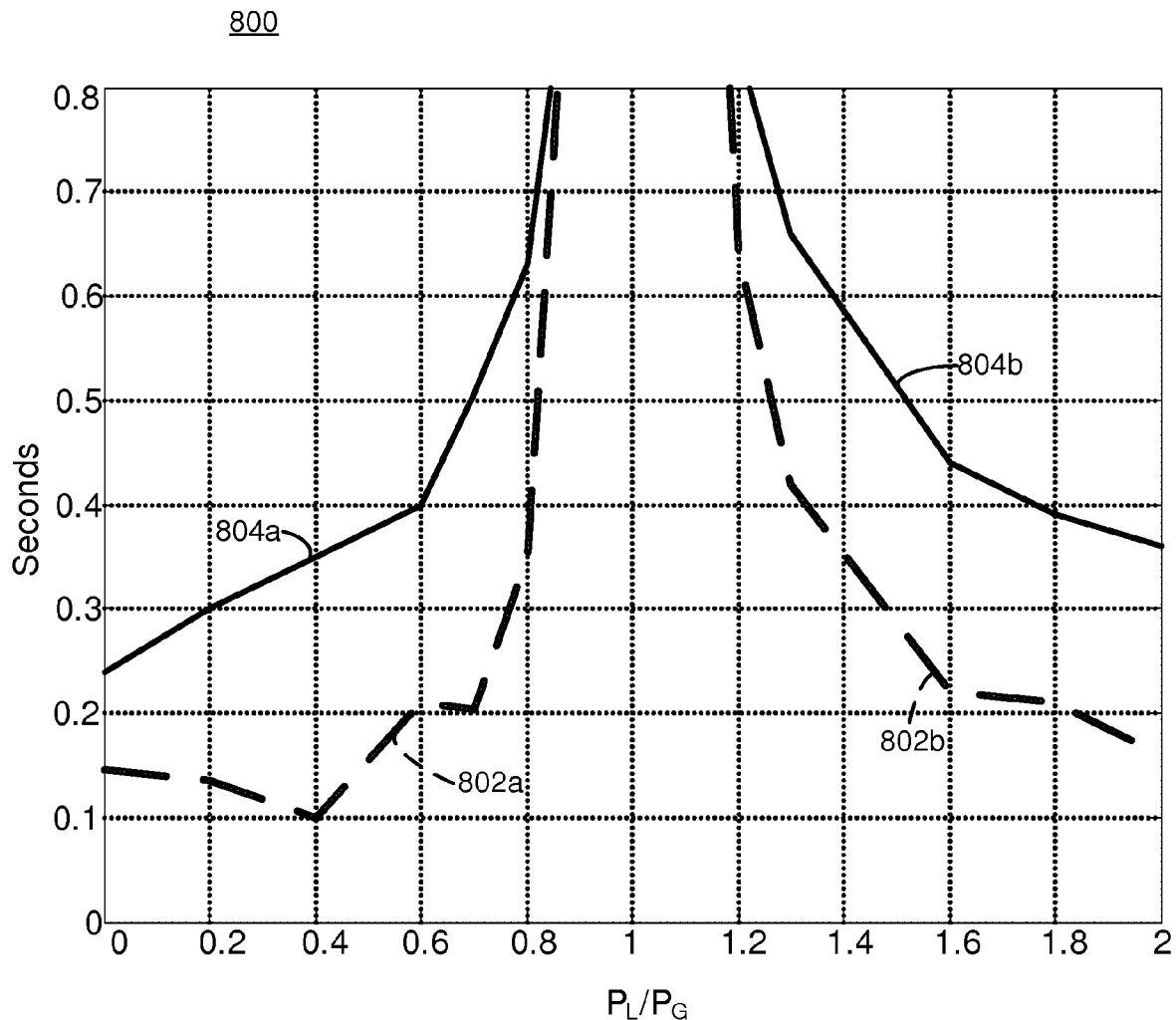
FIG. 8 is a graph comparing the time a typical element and the intelligent electronic device of FIG. 2 take to detect an islanding condition given different load-power to generation-power conditions.

The protection characteristic 401 described above allows the IED 100 to detect islanding conditions quickly and effectively. FIG. 8 is a graph 800 comparing the time for the IED 100 and a typical under/over frequency element to detect an islanding condition given different load-power ($P_L$) to generation-power ($P_G$) ratios. Lines 802a and 802b represent the performance of the IED 100 and lines 804a and 804b represent the performance of the typical element. The ordinate of the graph 800 represents the amount of time in seconds to detect the islanding condition, and the abscissa of the graph 800 represents a ratio of the power ($P_L$) consumed by the load 40 to the power ($P_G$) generated by the generator 12c. As shown in the graph 800, the IED 100 is able to detect the islanding condition faster than the typical element, especially as the $P_L/P_G$ ratio is less than 0.8 or greater than 1.2. For example, when the $P_L/P_G$ ratio is 0.6, the IED 100 is able to detect the islanding condition in approximately 0.2 seconds compared to approximately 0.4 seconds for the typical element.

Although protection characteristics 401 and 451 have been described as having two trip regions 408a and 408b (or 458a and 458b), the protection characteristic 401, 451 may include more or fewer than two trip regions. For example, the protection characteristic 401, 451 may include only the trip region 408a (or 458a), and the processing unit 132 may be configured to compare the absolute values of the frequency deviation and the rate-of-change of frequency to obtain the operating point and determine if it is inside or outside of the trip region 408a (or 458a). Furthermore, although FIGS. 4A and 4B show that the boundary lines 406a, 406b, 406c, 406d, 406e, 406f, 456a, and 456d are straight lines, these boundary lines need not be straight (e.g., a second (or higher) order polynomial function may be used to derive one or more of the boundary lines 406a, 406b, 406c, 406d, 406e, 406f, 456a, and 456d).

While specific embodiments and applications of the disclosure have been illustrated and described, it is to be understood that the disclosure is not limited to the precise configuration and components disclosed herein. Various modifications, changes, and variations apparent to skilled persons may be made in the arrangement, operation, and details of the methods and systems of the disclosure without departing from the spirit and scope of the disclosure.

What is claimed is:

1. An intelligent electronic device for detecting an islanding condition in an electrical power delivery system, comprising:
an input for receiving a signal of the electrical power delivery system;
a processing unit configured to detect an islanding condition based on the signal, the processing unit being operable to determine from the signal a frequency deviation of electrical power delivery system from nominal frequency and a rate-of-change of frequency of the electrical power delivery system, the frequency deviation and the rate-of-change of frequency defining an operating point of the electrical power delivery system, the processing unit being operable to compare the operating point to a protection characteristic of the intelligent electronic device, wherein the processing unit is operable to issue a command based upon the comparison; and
an output in communication with the processing unit to communicate the command from the processing unit;
wherein the protection characteristic comprises a trip region that includes a frequency deviation axis and a rate-of-change of frequency axis.

2. The intelligent electronic device of claim 1, wherein the protection characteristic is derived by settings representing selected frequency deviation and rate-of-change of frequency values.

3. The intelligent electronic device of claim 2, wherein the settings include a first setting representing a first frequency deviation value, a second setting representing a second frequency deviation value, a third setting representing a first rate-of-change of frequency value, and a fourth setting representing a second rate-of-change of frequency value.

4. The intelligent electronic device of claim 3, wherein the processing unit is operable to compare the operating point to a trip region of the protection characteristic derived from the first, second, third, and fourth settings.

5. The intelligent electronic device of claim 4, wherein the trip region comprises a first boundary derived from a function of the form $$\left((\Delta f - SET1) \times \left(\frac{SET3 - SET4}{SET2 - SET1}\right)\right) + SET4$$

where Δf is the frequency deviation of the electrical power delivery system, and SET1, SET2, SET3, and SET4 are the first, second, third, and fourth settings respectively, and the processing unit is operable to compare the operating point to the first boundary.

6. The intelligent electronic device of claim 5, wherein the trip region includes a second boundary corresponding to the first frequency deviation value represented by the first setting, and the processing unit is operable to compare the operating point to the second boundary.

7. The intelligent electronic device of claim 6, wherein the trip region includes a third boundary corresponding to the first rate-of-change of frequency value represented by the third setting, and the processing unit is operable to compare the operating point to the third boundary.

8. The intelligent electronic device of claim 4, wherein the trip region comprises a first boundary derived from a function of the form $$\left((\Delta f + SET1) \times \left(\frac{SET3 - SET4}{SET2 - SET1}\right)\right) - SET4$$

where Δf is the frequency deviation of the electrical power delivery system, and SET1, SET2, SET3, and SET4 are the first, second, third, and fourth settings respectively, and the processing unit is operable to compare the operating point to the first boundary.

9. The intelligent electronic device of claim 3, wherein the protection characteristic includes a trip region defined in a plane that includes a frequency deviation axis and a rate-of-change of frequency axis transverse to the frequency deviation axis, the trip region being derived from the first, second, third, and fourth, settings.

10. The intelligent electronic device of claim 9, wherein the trip region includes a boundary line derived from the first, second, third, and fourth settings.

11. The intelligent electronic device of claim 10, wherein the boundary line includes a line segment between first and second boundary points in the plane, the first boundary point having coordinates corresponding to the first and fourth settings, and the second boundary point having coordinates corresponding to the second and third settings.

12. The intelligent electronic device of claim 11, wherein the boundary line is a straight line.

13. The intelligent electronic device of claim 11, wherein the boundary line has a negative slope.

14. The intelligent electronic device of claim 11, wherein the trip region is a first trip region, and the protection characteristic includes a second trip region defined in the plane, the second trip region being derived from the first, second, third, and fourth settings.

15. The intelligent electronic device of claim 14, wherein the second trip region includes a boundary line derived from the first, second, third, and fourth settings.

16. The intelligent electronic device of claim 15, wherein the boundary line of the second trip region is parallel to the boundary line of the first trip region.

17. The intelligent electronic device of claim 15, wherein the protection characteristic includes a stable operation region provided between the boundary lines of the first and second trip regions to prevent stable frequency oscillations of the electrical power delivery system from generating trip commands.

18. The intelligent electronic device of claim 2, wherein the settings include a first setting representing a frequency deviation value and a second setting representing a rate of change of frequency value, the protection characteristic including a trip region derived from the first and second settings, and the processing unit being operable to compare the operating point to the trip region.

19. The intelligent electronic device of claim 18, wherein the trip region includes a boundary derived from a function of the form $$\Delta f \times \left(-\frac{SETY}{SETX}\right) + SETY$$

where Δf is the frequency deviation of the electrical power delivery system, SETX is the first setting, and SETY is the second setting, and the processing unit is operable to compare the operating point to the boundary.

20. The intelligent electronic device of claim 18, wherein the trip region is defined in a plane that includes a frequency deviation axis and a rate-of-change of frequency axis transverse to the frequency deviation axis, the trip region including a boundary line extending between first and second boundary points in the plane, the first boundary point having a coordinate corresponding to the first setting, and the second boundary point having a coordinate corresponding to the second setting.

21. The intelligent electronic device of claim 1, wherein the signal corresponds to a voltage of the electrical power delivery system.

22. The intelligent electronic device of claim 1, wherein the signal corresponds to a current of the electrical power delivery system.

23. The intelligent electronic device of claim 1,
wherein the processing unit is operable to issue the command when a fault detector of the electrical power delivery system has not detected a system fault.

24. The intelligent electronic device of claim 23, wherein the fault detector represents a system operating in the intelligent electronic device.

25. The intelligent electronic device of claim 23, wherein the fault detector represents a system operating on another device.

26. The intelligent electronic device of claim 1, wherein
the output comprises a trip output and the command comprises a trip command, and
the trip output is further in communication with a circuit breaker to communicate the trip command from the processing unit to the circuit breaker.

27. The intelligent electronic device of claim 1, wherein
the output comprises an alarm output and the command comprises an alarm command, and
the alarm output is further in communication with a communications interface to communicate the alarm command from the processing unit to the communications interface.

28. A method of detecting an islanding condition in an electrical power delivery system, comprising:
receiving a signal derived from the electrical power delivery system;
calculating in an intelligent electronic device a frequency deviation of the electrical power delivery system from nominal frequency based on the signal;
calculating in the intelligent electronic device a rate-of-change of frequency of the electrical power delivery system based on the signal, the frequency deviation and the rate-of-change of frequency defining an operating point of the electrical power delivery system; and
comparing the operating point to a protection characteristic of the intelligent electronic device to determine whether an islanding condition has occurred,
wherein the protection characteristic comprises a trip region that includes a frequency deviation axis and a rate-of-change or frequency axis.

29. The method of claim 28, wherein the protection characteristic includes settings representing selected frequency deviation and rate-of-change of frequency values.

30. The method of claim 29, further comprising deriving a trip region of the protection characteristic value from the settings.

31. The method of claim 30, wherein the settings include a first setting SET1 representing a first frequency deviation value, a second setting SET2 representing a second frequency deviation value, a third setting SET3 representing a first rate-of-change of frequency value, and a fourth setting SET4 representing a second rate-of-change of frequency value, and the trip region is derived from a function of the form $$\left((\Delta f - SET1) \times \left(\frac{SET3 - SET4}{SET2 - SET1}\right)\right) + SET4$$

where $\Delta f$ is the frequency deviation of the electrical power delivery system.

32. The method of claim 31, further comprising:
comparing the operating point against the trip region; and
generating a trip command when the operating point is within the trip region.

33. The method of claim 32, further comprising generating the trip command when the operating point is within the trip region for a selected period of time.

34. The method of claim 32, further comprising:
detecting whether a fault has occurred in the electrical power delivery system; and
transmitting the trip command to a circuit breaker when a fault has not been detected.

35. The method of claim 32, wherein the trip region is a first trip region, further comprising:
deriving a second trip region from a function of the form $$\left((\Delta f + SET1) \times \left(\frac{SET3 - SET4}{SET2 - SET1}\right)\right) - SET4;$$

comparing the operating point against the second trip region; and
generating the trip command when the operating point is within the second trip region.

* * * * *